United States Patent
Vierheilig et al.

(10) Patent No.: US 11,309,459 B2
(45) Date of Patent: Apr. 19, 2022

(54) OPTOELECTRONIC SEMICONDUCTOR DEVICE AND METHOD OF OPERATING AN OPTOELECTRONIC SEMICONDUCTOR DEVICE

(71) Applicant: OSRAM Opto Semiconductors GmbH, Regensburg (DE)

(72) Inventors: Clemens Vierheilig, Tegernheim (DE); Philipp Kreuter, Regensburg (DE); Rainer Hartmann, Regensburg (DE); Michael Binder, Barbing (DE); Tobias Meyer, Kelheim (DE)

(73) Assignee: OSRAM OLED GmbH, Regensburg (DE)

( * ) Notice: Subject to any disclaimer, the term of this patent is extended or adjusted under 35 U.S.C. 154(b) by 76 days.

(21) Appl. No.: 16/495,144

(22) PCT Filed: Apr. 16, 2018

(86) PCT No.: PCT/EP2018/059683
§ 371 (c)(1),
(2) Date: Sep. 18, 2019

(87) PCT Pub. No.: WO2018/192879
PCT Pub. Date: Oct. 25, 2018

(65) Prior Publication Data
US 2020/0044117 A1 Feb. 6, 2020

(30) Foreign Application Priority Data

Apr. 18, 2017 (DE) .................... 10 2017 108 199.2

(51) Int. Cl.
*H01L 33/42* (2010.01)
*H01L 33/30* (2010.01)
*H01L 33/00* (2010.01)

(52) U.S. Cl.
CPC .......... *H01L 33/42* (2013.01); *H01L 33/0066* (2013.01); *H01L 33/30* (2013.01)

(58) Field of Classification Search
None
See application file for complete search history.

(56) References Cited

U.S. PATENT DOCUMENTS 8,710,512 B2 * 4/2014 Albrecht ............... H01L 33/385
257/79
2003/0075723 A1 4/2003 Heremans et al.
(Continued)

FOREIGN PATENT DOCUMENTS

DE 20 2006 003 360 U1 6/2006
DE 10 2008 024 327 A1 11/2009
JP S63-313887 A 12/1988

*Primary Examiner* — Robert K Carpenter
(74) *Attorney, Agent, or Firm* — DLA Piper LLP (US)

(57) ABSTRACT

An optoelectronic semiconductor device includes a semiconductor layer sequence including an active zone that generates radiation by electroluminescence; a p-electrode and an n-electrode; an electrically insulating passivation layer on side surfaces of the semiconductor layer sequence; and an edge field generating device on the side surfaces on a side of the passivation layer facing away from the semiconductor layer sequence at the active zone, wherein the edge field generating device is configured to generate an electric field at least temporarily in an edge region of the active zone so that, during operation, a current flow through the semiconductor layer sequence is controllable in the edge region.

19 Claims, 12 Drawing Sheets

(56) References Cited

U.S. PATENT DOCUMENTS

| | | | |
|---|---|---|---|
| 2003/0222269 A1* | 12/2003 | Lin | H01L 33/145 257/99 |
| 2012/0119245 A1 | 5/2012 | Chen | |
| 2015/0179873 A1 | 6/2015 | Wunderer et al. | |
| 2016/0141331 A1 | 5/2016 | Yang et al. | |
| 2017/0071042 A1 | 3/2017 | Song et al. | |
| 2017/0092821 A1 | 3/2017 | Chae et al. | |
| 2018/0374994 A1 | 12/2018 | Ebbecke et al. | |

\* cited by examiner $$\Phi_s + V_{ox} = -[\Phi_m - (\chi + \frac{E_g}{2e} + \Phi_{fp})] + V$$

$$\Phi_{fp} = \frac{kT}{e} \ln(\frac{N_a}{n_i})$$

A)

B)

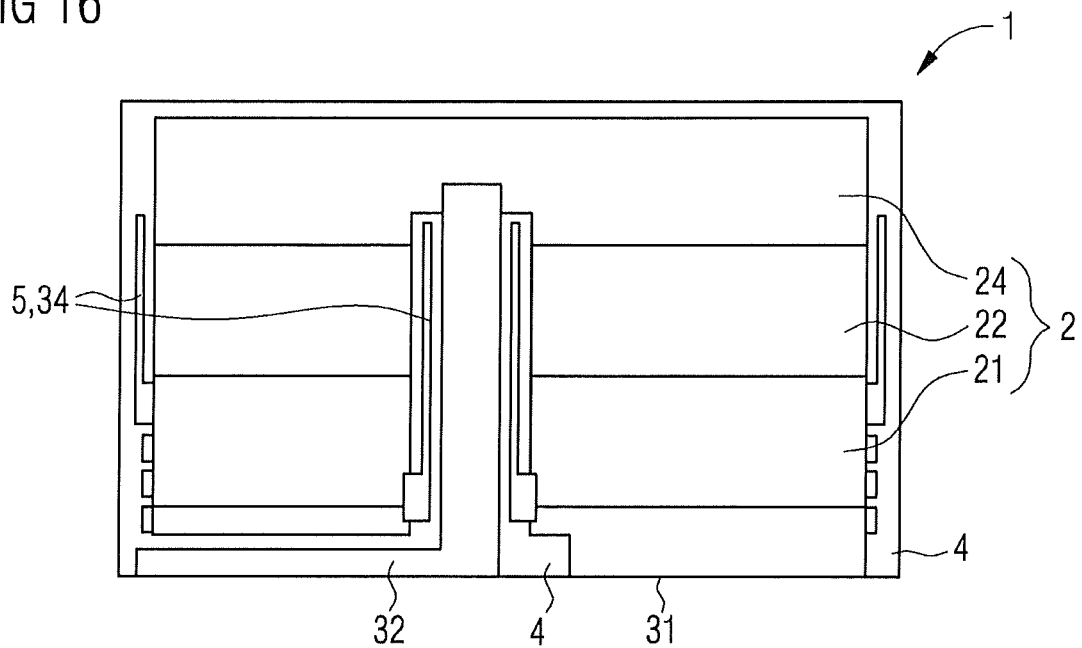
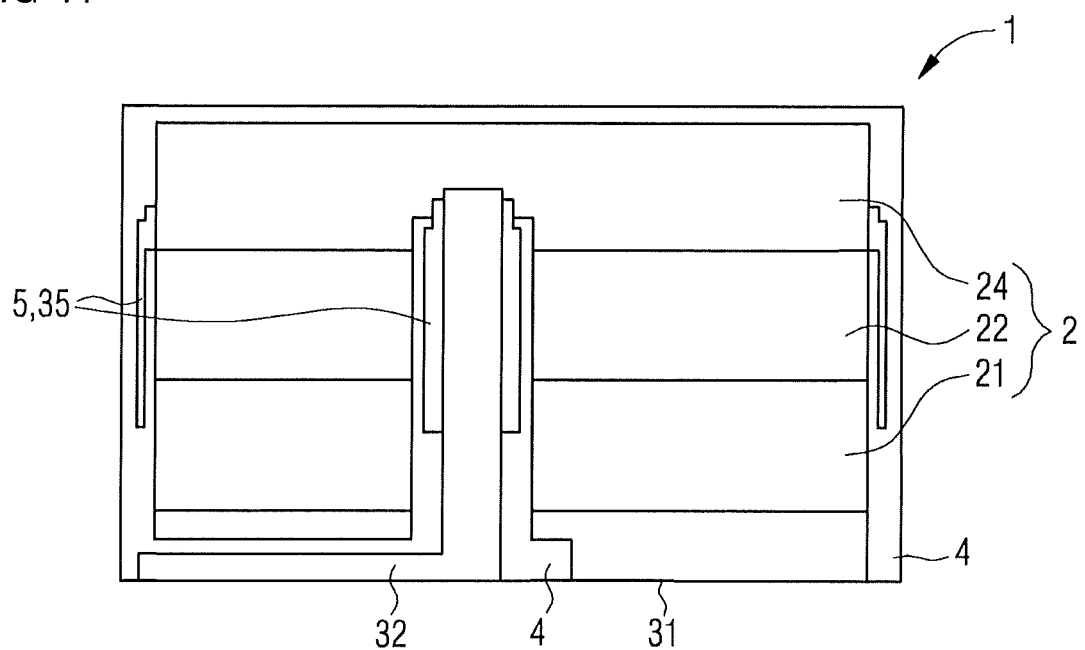

OPTOELECTRONIC SEMICONDUCTOR DEVICE AND METHOD OF OPERATING AN OPTOELECTRONIC SEMICONDUCTOR DEVICE

TECHNICAL FIELD

This disclosure relates to an optoelectronic semiconductor device and a method of operating an optoelectronic semiconductor device.

BACKGROUND

There is a need to provide an optoelectronic semiconductor device that is highly efficient, especially at low current densities.

SUMMARY

We provide an optoelectronic semiconductor device including a semiconductor layer sequence including an active zone that generates radiation by electroluminescence; a p-electrode and an n-electrode; an electrically insulating passivation layer on side surfaces of the semiconductor layer sequence; and an edge field generating device on the side surfaces on a side of the passivation layer facing away from the semiconductor layer sequence at the active zone, wherein the edge field generating device is configured to generate an electric field at least temporarily in an edge region of the active zone so that, during operation, a current flow through the semiconductor layer sequence is controllable in the edge region.

We also provide a method of operating the optoelectronic semiconductor device including a semiconductor layer sequence including an active zone that generates radiation by electroluminescence; a p-electrode and an n-electrode; an electrically insulating passivation layer on side surfaces of the semiconductor layer sequence; and an edge field generating device on the side surfaces on a side of the passivation layer facing away from the semiconductor layer sequence at the active zone, wherein the edge field generating device is configured to generate an electric field at least temporarily in an edge region of the active zone so that, during operation, a current flow through the semiconductor layer sequence is controllable in the edge region, and an electric field is generated temporarily or permanently in the circumferential edge region of the active zone by the edge field generating device, whereby, during operation, a current flow through the semiconductor layer sequence in the edge region is controlled.

We further provide an optoelectronic semiconductor device including a semiconductor layer sequence including an active zone that generates radiation by electroluminescence; a p-electrode and an n-electrode; an electrically insulating passivation layer on side surfaces of the semiconductor layer sequence; and an edge field generating device on the side surfaces on a side of the passivation layer facing away from the semiconductor layer sequence at the active zone, wherein the edge field generating device is configured to generate an electric field at least temporarily in an edge region of the active zone so that during operation a current flow through the semiconductor layer sequence is controllable in the edge region, and (i) one of the electrodes extends through the active zone in the form of pins and the edge field generating device extends annularly around at least some of the pins and/or (ii) the semiconductor layer sequence is pixelated to islands, the edge field generating device extending directly around at least some of the islands.

BRIEF DESCRIPTION OF THE DRAWINGS

FIGS. 1, 2, 4, 6, 7A-7B to 9, 13 and 15 to 20 show schematic sections of examples of optoelectronic semiconductor devices.

Figure 1:
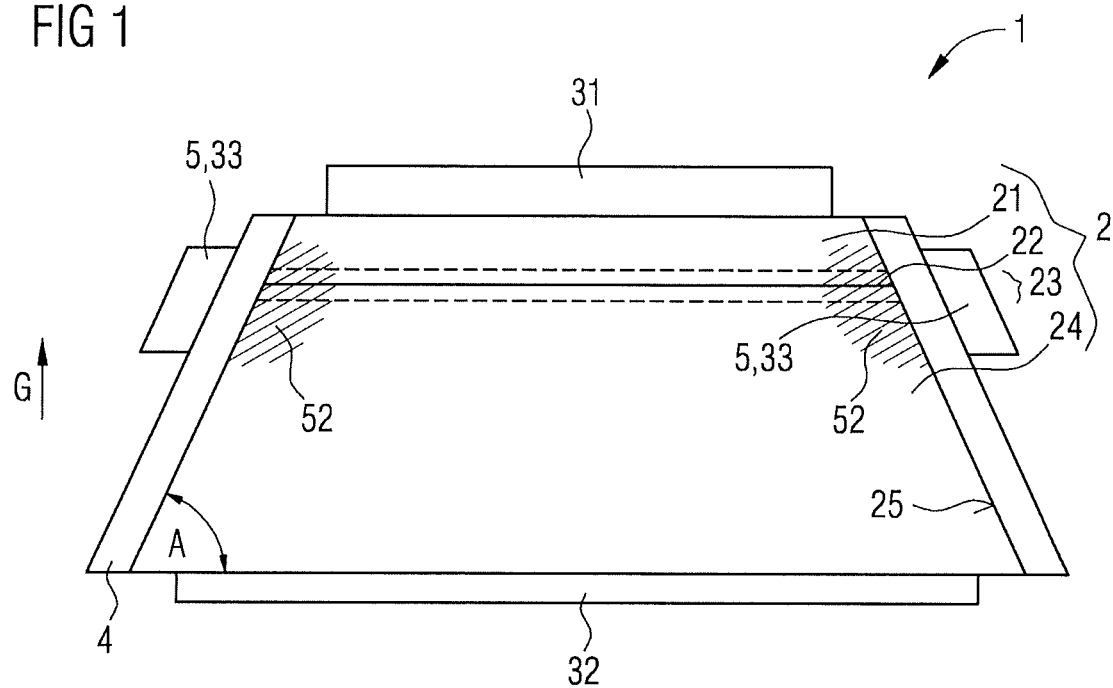

LIST OF REFERENCE SIGNS 1 optoelectronic semiconductor device
2 semiconductor layer sequence
21 p-conducting region
22 active zone
23 space charge zone
24 n-conducting region
25 side surface of the semiconductor layer sequence
31 p-electrode
32 n-electrode
33 further electrode
34 first electrode extension
35 second electrode extension
4 electrically insulating passivation layer
5 edge field generating device
52 edge region of the active zone
56 surface charge
57 electrostatic layer
58 sublayer of the electrostatic layer
6 carrier
71 outer contour line of the active zone
72 boundary line of the active zone
A flank angle
G direction of growth

DETAILED DESCRIPTION

Our optoelectronic semiconductor device may comprise a semiconductor layer sequence. The semiconductor layer sequence may have an active zone that generates radiation by electroluminescence. In particular, the active zone is arranged to generate radiation with a wavelength of maximum intensity of at least 360 nm or 420 nm and/or of at most 860 nm or 560 nm or 480 nm. Preferably, incoherent radiation is generated. The semiconductor device is thus a light-emitting diode, or LED for short. For example, blue light or green light or red light is generated during operation, preferably blue light. Fluorescent materials may be used to convert the generated radiation.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also around an arsenide compound semiconductor material such as $Al_nIn_{1-n-m}Ga_mAs$ or such as $Al_nGa_mIn_{1-n-m}As_kP_{1-k}$, wherein $0 \leq n \leq 1$, $0 \leq m \leq 1$ and $n+m \leq 1$ as well as $0 \leq k < 1$ hold. Preferably, for at least one layer or for all layers of the semiconductor layer sequence $0 \leq n \leq 0.8$, $0.4 \leq m < 1$ and $n+m \leq 0.95$ as well as $0 < k \leq 0.5$ hold. The semiconductor layer sequence may contain dopants as well as additional components. For the sake of simplicity, however, only the essential components of the crystal lattice of the semiconductor layer sequence are indicated, i.e., Al, As, Ga, In, N or P, even if they may be partially replaced and/or supplemented by small quantities of other substances.

The semiconductor layer sequence may be located between a p-electrode and an n-electrode. The semiconductor layer sequence may be in direct contact with the electrodes. Preferably, the electrodes are attached to the semiconductor layer sequence in an areal manner.

The electrodes may be attached to a common main side of the semiconductor layer sequence, wherein one of the electrodes may extend through the active zone. It is also possible for both electrodes to point to the same side and be attached at different heights relative to the active zone along a direction of growth of the semiconductor layer sequence.

In particular, the electrodes are ohmically conductive, in contrast to the semiconductor layer sequence. Furthermore, the electrodes are based on a different material system than the semiconductor layer sequence. For example, the electrodes are made of one or more metals and/or one or more transparent conductive oxides, or TCOs for short.

There may be at least one electrically insulating passivation layer on the side surfaces of the semiconductor layer sequence. This means that when the semiconductor device is used as intended, there is no current flow through the passivation layer. The side surfaces can be completely or only partially covered by the passivation layer. The passivation layer and/or the side surfaces may be oriented transversely to the p-electrode and the n-electrode. In particular, transverse means unequal parallel, for instance vertical or approximately vertical.

The semiconductor device may comprise an edge field generating device. The edge field generating device may be partially or completely located on the side surfaces of a side of the passivation layer remote from the semiconductor layer sequence. In particular, the edge field generating device is attached directly on the passivation layer.

The edge field generating device may be located at the active zone. This means, for example, that the edge field generating device partially or, preferably, completely covers the active zone in side view and in the direction perpendicular to a growth direction of the semiconductor layer sequence. Furthermore, this may mean that the edge field generating device, also seen in side view and in the direction perpendicular to the growth direction of the semiconductor layer sequence, completely or partially covers a space charge zone. The space charge zone, also called depletion zone or barrier layer, is a transition area between differently doped areas of the semiconductor layer sequence adjacent to the active zone. The extent of the space charge zone is preferably determined when the semiconductor device is switched off, if no electrical voltages are applied to the electrodes and/or both electrodes are grounded. An extent of the space charge zone, for example, is at least 50 nm and/or at most 200 nm, calculated from the outer limits of the active zone to the two electrodes.

The edge field generating device may be arranged to generate an electric field temporarily or permanently in a partially or completely circumferential edge region of the active zone. The electric field may be generated in particular by the fact that the edge field generating device is permanently electrically charged or has a permanent electrical charge distribution or that the edge field generating device is temporarily or permanently brought to an electrical potential other than zero. The electric field may emanate from the edge field generating device, penetrate the passivation layer and extend into the semiconductor layer sequence and the active zone.

A current flow through the semiconductor layer sequence may be influenced and/or controlled by the edge field generating device during operation of the semiconductor device at least in the edge region. In particular, a current flow through the edge field generating device is reduced or prevented in the edge region compared to a component of identical construction without an edge field generating device. Especially with low current densities, there is an excessive current flow directly at the passivation layer without an edge field generating device due to the band structure of the semiconductor layer sequence. This excessive current flow can preferably be reduced by the edge field generating device to such an extent that a current density at the edge is equal to or approximately equal to a current density in a central area of the active zone.

This means that with the edge field generating device a current flow and thus a charge carrier recombination in the edge area in the active zone is controllable or regulable or adjustable, in particular reducible. This allows leakage currents at the edge to be manipulated, especially at low current densities. It is also possible to set an area of the active zone in which a charge carrier recombination and thus light generation takes place by controlling the edge field generating device.

The optoelectronic semiconductor device may comprise a semiconductor layer sequence comprising an active zone that generates radiation by electroluminescence. An electrically insulating passivation layer is provided on side surfaces of the semiconductor layer sequence. The passivation layer and the side surfaces are preferably oriented transversely to the p-electrode and the n-electrode. An edge field generating device is located on the side surfaces on a side of the passivation layer remote from the semiconductor layer sequence and on the active zone and/or on a space charge zone. The edge field generating device is configured to generate an electric field at least temporarily in a preferably circumferential edge region of the active zone so that during operation a current flow through the semiconductor layer sequence in the edge region is regulable or controllable or adjustable.

With light emitting diodes, it is possible that part of the current flows off via leak paths at an etched mesa flank, i.e., at the side surfaces, and does not contribute to radiation generation. This effect reduces the efficiency of the component, especially at low current densities. Particularly with comparatively small components, an area-to-edge ratio becomes less favorable so that the effect of leakage currents across the mesa flank is more pronounced.

Possible ways of reducing leakage currents at the mesa flank include electrically nonconductive passivation layers on the mesa flank to at least reduce surface recombination by saturating surface states. Furthermore, it is possible to keep a current flow away from the mesa flank by diffusing in dopants or inactivating the active zone on the mesa flank.

In the semiconductor device, the valence band and the conduction band on the side surfaces are bent by specifically applied electric fields such that the charge carriers responsible for the leakage current, i.e., electrons or holes, are kept away from the side surfaces. By keeping the charge carriers away from the side surfaces, the leakage current is prevented. It is also possible to use the electric fields to selectively change an area of the active zone in which the light is generated. Thus, it is possible with the semiconductor device to improve the small current efficiency of light emitting diodes by avoiding leakage currents over the mesa edge.

The active zone may extend over the entire semiconductor layer sequence. A structure and a material composition of the active zone are preferably not specifically changed or varied. In particular, the active zone has grown directly at the side surfaces in the same manner as in an inner area of the semiconductor layer sequence. This means that the structure of the active zone alone does not show any difference between the edge region and other areas of the active zone.

The semiconductor device may be configured to be operated with low current densities and/or in the low current range. The preferred average current density in the active zone is at most 100 A/cm$^2$ or 10 A/cm$^2$ or 1 A/cm$^2$.

The edge field generating device may be one or more independent further electrodes. The at least one further electrode may be located at the active zone and/or at the space charge zone. The space charge zone may at least partially be covered by the further electrode, but beyond the space charge zone a part of the n-conducting and/or the p-conducting region may also be covered by the further electrode. This means that the semiconductor device can have a total of three electrodes, namely the p-electrode, the n-electrode and the further electrode. The edge field generating device can consist of the further electrode, optionally together with electrical leads to the further electrode.

The further electrode may be controllable independently of the p-electrode and the n-electrode. In particular, there is no direct electrical connection between the further electrode and the n-electrode and the p-electrode.

The further electrode may be located close to the p-electrode and/or the n-electrode. This makes the semiconductor device compact and space-saving. For example, a distance of at least 5 nm or 10 nm or 50 nm or 0.2 μm or 0.4 μm exists between the further electrode and the p-electrode and/or the n-electrode. Alternatively or additionally, this distance is at most 20 μm or 5 μm or 3 μm or 1.5 μm.

The edge field generating device may comprise or consist of a first electrode extension. The first electrode extension may be electrically short-circuited to the p-electrode. Short-circuited may mean that an electrical resistance between the electrode extension and the p-electrode is at most 5Ω or 0.2Ω. In particular, the first electrode extension is formed in one piece with the p-electrode. The p-electrode and the electrode extension may be identical or have different metallizations and/or layer sequences.

The edge field generating device may comprise or consist of a second electrode extension at the active zone. The second electrode extension may be electrically short-circuited and/or integral with the n-electrode. The second electrode extension can also be constructed in the same way as the n-electrode or be configured differently from the n-electrode, in particular with regard to material composition and/or layer structure.

The area of the semiconductor layer sequence not corresponding to the respective electrode extension may be predominantly free of the edge field generating device. In particular, the first electrode extension leaves at least 60% or 80% or 90% or 95% of the n-conductive region of the semiconductor layer sequence free on the side surfaces and/or the second electrode extension leaves at least 60% or 80% or 90% or 95% of the p-conductive region of the semiconductor layer sequence free on the side surfaces. In other words, the electrode extension covers not more than 5% or 10% or 20% or 40% of the region with opposite conductivity of the semiconductor layer sequence on the side surfaces.

The edge field generating device may comprise one or more electrostatic layers at the active zone or consist of one or more electrostatic layers. The at least one electrostatic layer is preferably capable of permanently generating a charge such as a surface charge on the side surfaces of the semiconductor layer sequence. The charge or surface charge can be generated directly in the semiconductor layer sequence or also in the passivation layer or can be limited to the electrostatic layer. The charge can be voluminous, also known as bulk. Furthermore, the charge can be generated at an interface between the electrostatic layer and the passivation layer and/or at an interface between the passivation layer and the semiconductor layer sequence.

The electrostatic layer may be electrically insulated from the exterior, i.e., the electrostatic layer is not electrically contacted during intended operation of the semiconductor device. In particular, the electrostatic layer is partially or completely made of an electrically insulating material or is completely covered by at least one electrically insulating material.

The electrostatic layer may have a layer stack. The layer stack may comprise one, two or more than two sublayers. The sublayers may in turn consist of subregions that preferably follow each other along a main direction of extension of the respective sublayer. The sublayers may be applied directly to one another or there may be electrically insulating intermediate layers between the sublayers. The sublayers or the subregions of the sublayers can be charged differently, for example, by different dopants. However, the sublayers can also be equally charged or uncharged, in this example with differently charged subregions.

The electrostatic layer may have a layer stack. The layer stack may comprise two or more than two subregions. The subregions can be formed by continuous sublayers. The subregions or sublayers can be applied directly to each other or there are electrically insulating intermediate layers between the subregions or sublayers. The subregions or sublayers are preferably charged differently, for example, by different doping. The subregions or sublayers can also be equally charged or uncharged. Within a sublayer there can be several subregions that preferably follow each other along a main direction of extension of the respective sublayer. The sublayers or subregions can be sharply separated from each other in terms of electrical charge and/or material composition or gradually merge into each other.

The electrostatic layer as a whole may be electrically neutral and uncharged. This means that in total the electrostatic layer has neither a positive electrical charge nor a negative electrical charge. However, there may be a charge separation in the electrostatic layer so that the electrostatic layer is locally positively charged and locally negatively charged. For example, at least one of the sublayers is positively charged and at least another of the sublayers is negative.

The edge region in which the current flow is set or regulated or inhibited due to the edge field generating device may have an average width of at least 0.1 μm or 0.5 μm or 1 μm or 1.5 μm in top view. Alternatively or additionally, the mean width shall not exceed 10 μm or 5 μm or 3 μm. The fact that the current flow is prevented means, for example, that the current flow in the edge region does not exceed 10% or 1% of a specified current intensity for light generation. In particular, the edge region is dark compared to other areas of the active zone since no radiation or a significant proportion of radiation is generated in the edge region. A suppression of the entire current flow at the edge region is not necessarily the aim of the edge field generation device. The main objective is to eliminate the abnormally high parasitic current flow at the edge region which can occur without the edge field generating device.

Due to the edge field generating device, a current density in the edge region may be at the same value as in the central area of the active zone. This applies in particular with a tolerance of not more than a factor of 3 or 2 or 1.5.

A quotient of a total area of the active zone and an area of the edge region may be at least 1 or 2 or 5 in a semiconductor device in intended operation permanently or temporarily in top view. Alternatively or additionally, this quotient is at most 50 or 20 or 10. In other words, the edge region may occupy a comparatively large proportion of the active zone in intended operation.

A quotient of a total area of the active zone and an area of the edge region may be at least 20 or 50 or 100 in a semiconductor device in specified normal operation, either permanently or temporarily in plan view. Alternatively or additionally, this quotient is at most 10000 or 1000 or 500. In other words, the edge region then may occupy a comparatively small portion of the active zone in specified normal operation.

The active zone may have an outer contour line in top view, compared to which a boundary line of the active zone is larger by at least a factor of 2 or 1.5 or 4. The boundary line is a line that runs directly along the side surfaces of the active zone. The boundary line thus corresponds to a real length of the active zone on the side surfaces. In particular, the outer contour line is the shortest possible line through which the entire active zone can be enclosed in top view.

A quotient of the area of the active area and the boundary line may be smaller than 20 µm or 100 µm or 500 µm. Alternatively or additionally, this quotient is at least 10 µm or 3 µm or 1 µm.

The edge field generating device may extend predominantly, in particular to at least 60% or 80% or 90% or 95% or even completely, along the contour line and/or the boundary line. This means that the whole or essentially the whole edge region can be influenced by the edge field generating device.

A base area surrounded by the contour line may be filled to at least 60% or 80% or 90% by the active zone. In other words, there are no significant voids within the outer contour line that are free of the active zone. This means that essentially the entire base area surrounded by the contour line is formed by the edge region together with an emission area of the active zone configured to generate light.

The semiconductor layer sequence may be a thin-film chip. This means that a growth substrate is removed from the semiconductor layer sequence. Thin-film chip means in particular that there is a substrateless semiconductor layer sequence.

The passivation layer may have an average thickness of at least 5 nm or 10 nm or 20 nm or 50 nm. Alternatively or additionally, the average thickness of the passivation layer shall not exceed 1 µm or 500 nm or 250 nm. In particular, the passivation layer defines a distance between the edge field generating device and the side surfaces of the semiconductor layer sequence. Thus, the edge field generating device is preferably located very close to the side surfaces of the active zone.

We also provide an operating method. The operating method is preferably configured to operate an optoelectronic semiconductor device, as indicated in conjunction with one or more of the above examples. Features of the operating method are therefore also disclosed for the optoelectronic semiconductor device and vice versa.

In the operating method, the optoelectronic semiconductor device may be operated such that an electric field is generated temporarily or permanently in the circumferential edge region of the active zone by the edge field generating device, with the result that during operation a current flow through the semiconductor layer sequence in the edge region is controlled, in particular prevented.

The edge field generating device may comprise the further electrode. An electrical voltage of at least 10 V or 15 V or 30 V or 60 V may be temporarily or permanently applied to the further electrode. This voltage difference occurs in particular between the edge field electrode and the p-electrode or between the edge field electrode and the n-electrode.

The edge region may temporarily or permanently occupy at least 5% or 25% or 50% or 75% of the active zone in top view. It is possible that the edge region temporarily covers the entire active zone in top view.

In the following, an optoelectronic semiconductor device and an operating method will be explained in more detail with reference to the drawings on the basis of examples. The same reference signs indicate the same elements in the individual figures. However, no true-to-scale references are shown, rather individual elements may be exaggeratedly large for a better understanding.

FIG. 1 illustrates an example of an optoelectronic semiconductor device 1. The semiconductor device 1 comprises a semiconductor layer sequence 2 that is preferably based on the AlInGaN material system. Between a p-conducting region 21 and an n-conducting region 24 there is an active zone 22 configured for radiation generation. A space charge zone 23 is formed around the active zone 22 between the doped areas 21, 24 when semiconductor device 1 is switched off. The space charge zone 23 has an extent of approximately 150 nm along a growth direction G of the semiconductor layer sequence 2, which is oriented perpendicular to the active zone 22. A thickness of the total semiconductor layer sequence 2 is preferably at least 2 µm and/or at most 10 µm. The space charge zone 23 is thin compared to the total semiconductor layer sequence 2.

An electrically insulating passivation layer 4 is applied directly to side surfaces 25 of the semiconductor layer sequence. The passivation layer 4, for example, is made of an oxide such as silicon dioxide or a nitride such as silicon nitride. A thickness of passivation layer 4 is about 100 nm. The passivation layer 4 can have an unchanged, constant layer thickness. The side surfaces 25 have a flank angle A to the main sides of the semiconductor layer sequence 2, which is preferably at least 30° or 70° and/or at most 90° or 85°.

Furthermore, the semiconductor device 1 comprises an edge field generating device 5. According to FIG. 1, the edge field generating device 5 is formed by a further electrode 33 electrically separated from the p-electrode 31 and the n-electrode 32. The further electrode 33 completely covers the space charge zone 23 when viewed laterally in the direction parallel to the active zone 22. The further electrode 33 located directly on the passivation layer 4, is formed, for example, by one or more metal layers and/or by one or more layers of a transparent conductive oxide.

The further electrode 33 can be brought to a positive or a negative potential to prevent leakage currents that would otherwise occur on the side surfaces 25 by selectively bending the conduction band and the valence band of the semiconductor layer sequence 2. The electric fields generated by the further electrode 33 can keep the relevant charge carriers, i.e., electrons or holes, away from the side surfaces. Thus, a current density in the edge region 52 can be set to approximately the same value as in a central area of the active zone 22.

The further electrode 33 thus prevents an excessive loss of light due to non-radiating charge carrier recombination in the active zone and/or prevents light generation in the active zone 22 in an edge region 52, symbolized by hatching in FIG. 1. In the direction parallel to the active zone 22, for example, the edge region 52 has an extent of approximately 1 μm. The extent of the edge region 52 is set by the voltage applied to the further electrode 33.

Figure 2:
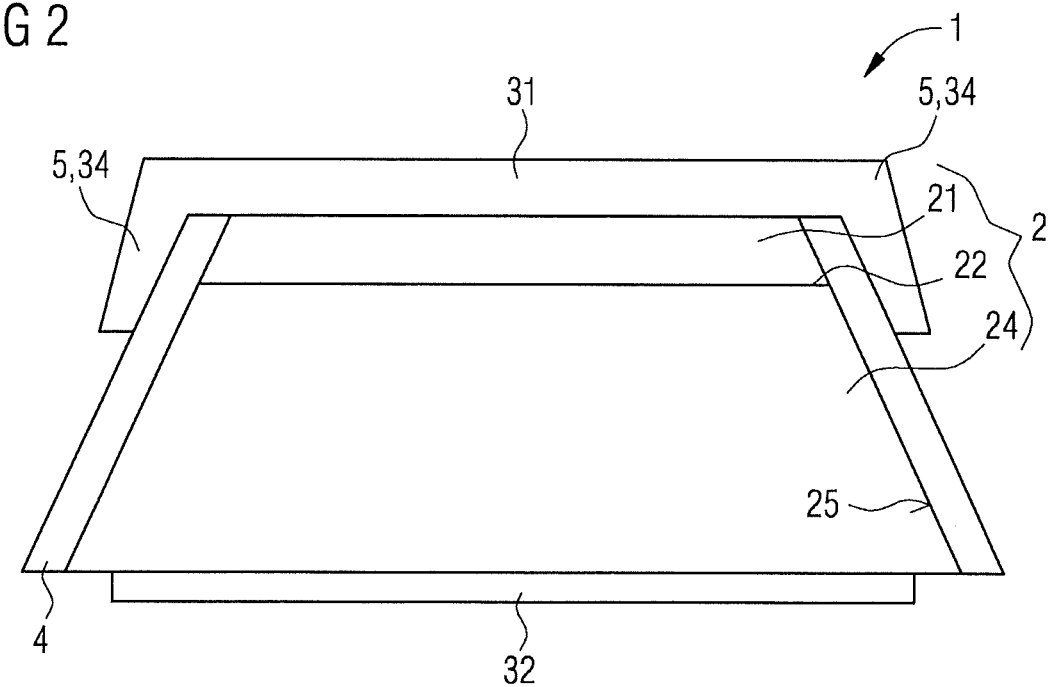

In contrast to FIG. 1, the edge field generating device 5 is formed by an electrode extension 34 as shown in FIG. 2. The electrode extension 34 starts from the p-electrode 31 and extends to, preferably beyond, the active zone 22. The n-conducting region 24 is predominantly, for instance to at least 60% or 80%, free of the electrode extension 34. The side surfaces 25 may be completely covered by the electrode extension 34 in the region of the p-conductive region 21.

Figure 3:
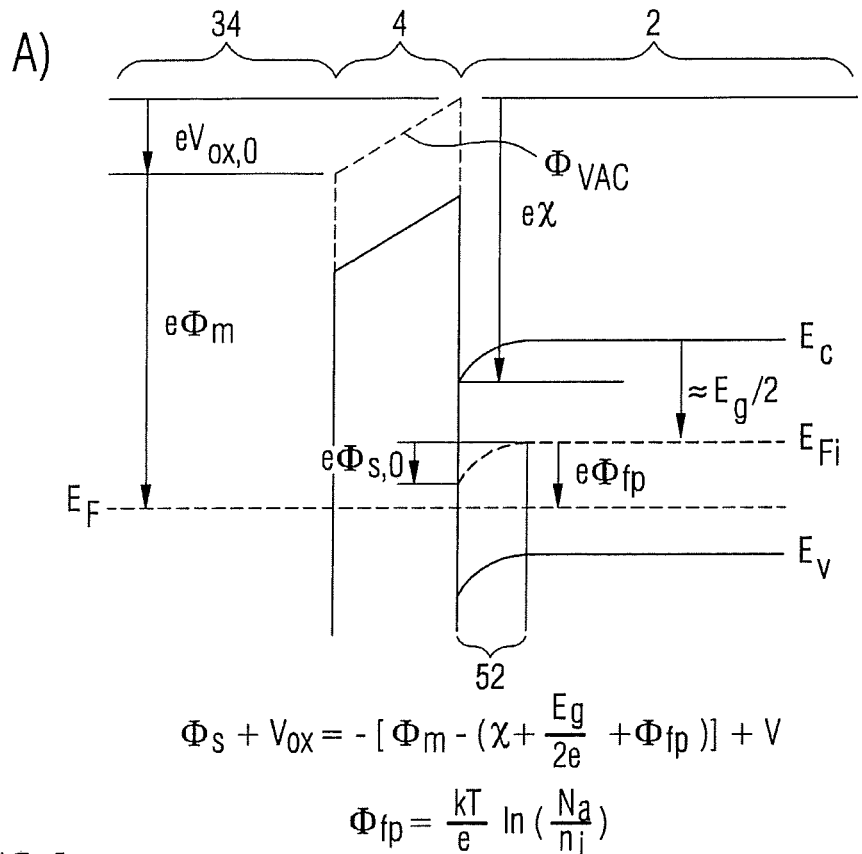
FIGS. 3A-3B and 5A-5B show schematic band structures at the active zone in a method of operation for examples of optoelectronic semiconductor devices.
Figure 3:
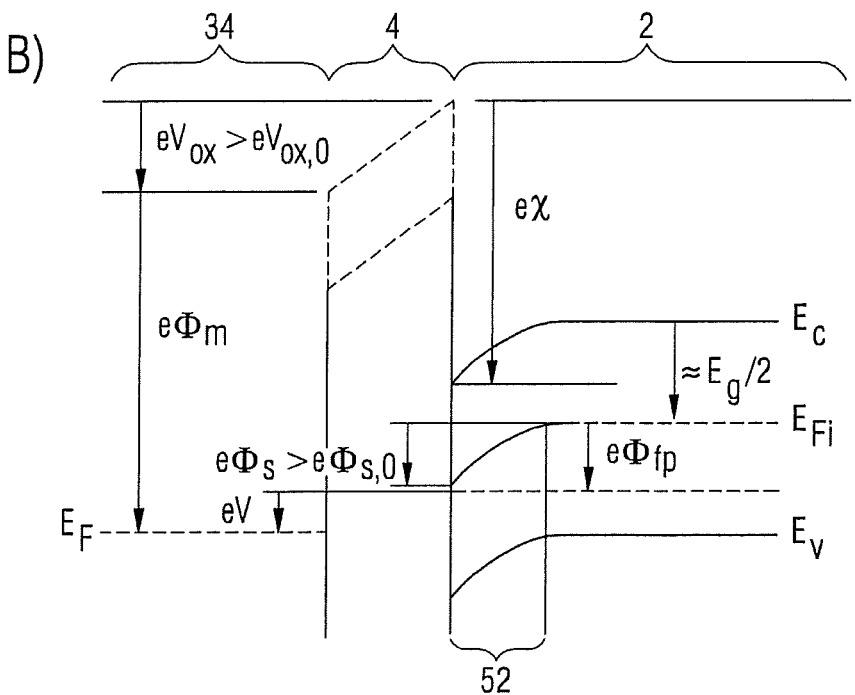

FIG. 3 illustrates the electrical band structure in the area of the dash dot line of FIG. 2, FIG. 3A in thermal equilibrium and FIG. 3B with the voltage applied to the electrodes.

V stands for an electrical voltage and Φ for a work function. e stands for the elementary charge, E for energies. The index VAC refers to the vacuum energy level, the index ox refers to the passivation layer, the index m to the electrode extension 34. The index g denotes the band gap, the index c the conduction band and the index v the valence band and the index Fi the intrinsic Fermi energy. The index s refers to the interface between the semiconductor layer sequence 2 and the passivation layer 4. The index 0 refers to the thermal equilibrium. The index χ is the semiconductor electron affinity. V, without index, refers to the applied voltage, i.e., the difference between the electrical potential at p-electrode 31 and the electrical potential of the p-conducting region 21. $N_a$ stands for the acceptor dopant concentration, $n_i$ for the intrinsic charge carrier concentration. A temperature of 300 K is decisive.

According to FIG. 3A, the metal's work function must be smaller than the sum of the electron affinity and the energy distance of the conduction band from the Fermi energy to achieve a positive surface potential in thermal equilibrium. In this example, holes are driven away from the interface between the semiconductor layer sequence 2 and the passivation layer 4 and a charge zone, corresponding to the edge region 52, is formed.

The application of a forward voltage, i.e., V>0, expands the edge region 52 and leads to a displacement of holes from the edge region 52 as shown in FIG. 3B. The applied voltage V across the passivation layer 4 corresponds approximately to the contact voltage at p-electrode 31.

Figure 4:
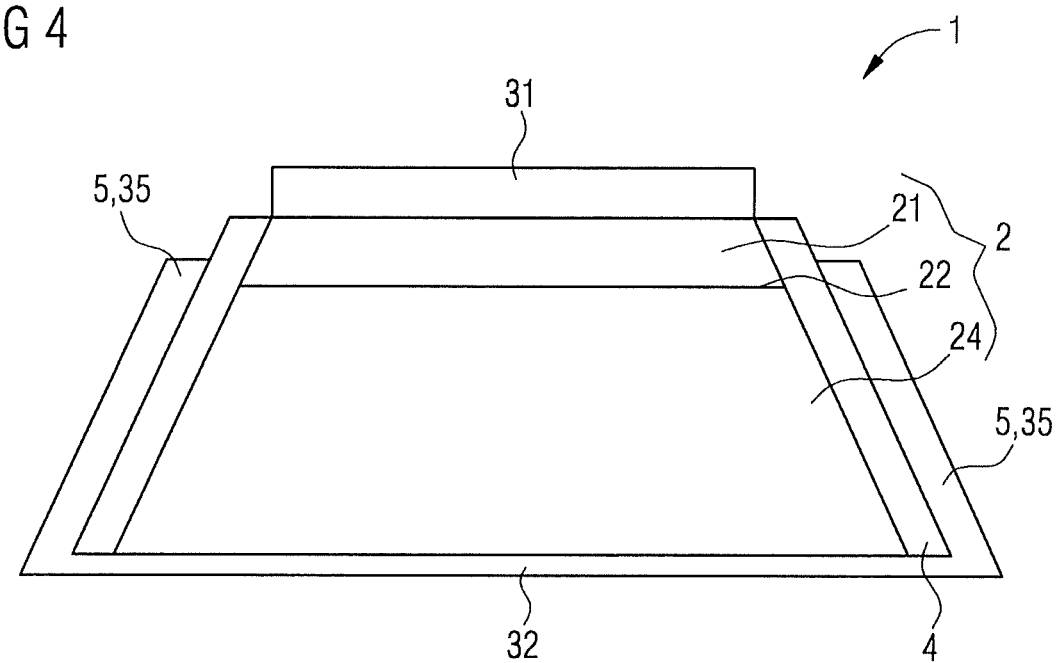

In FIG. 4 another example of the semiconductor device 1 is shown. Contrary to FIG. 2, there is an electrode extension 35 forming the edge field generating device 5. The electrode extension 35 is electrically short-circuited with the n-electrode 32 and integrally formed. In all other respects, the explanations for FIG. 2 apply accordingly.

Figure 5:
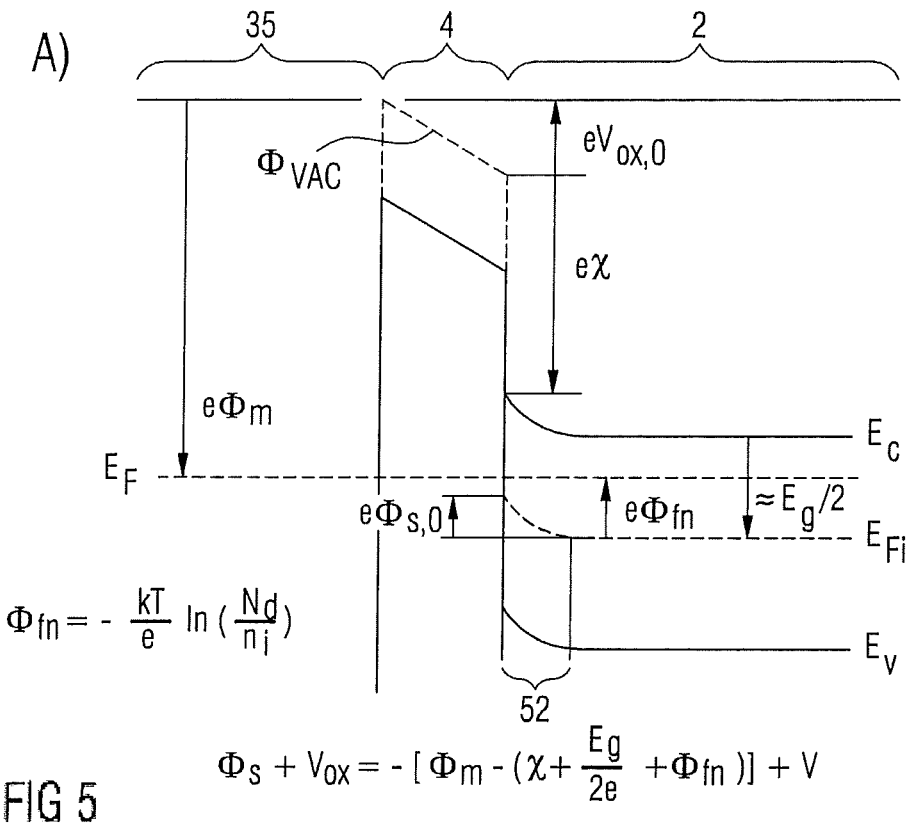
Figure 5:
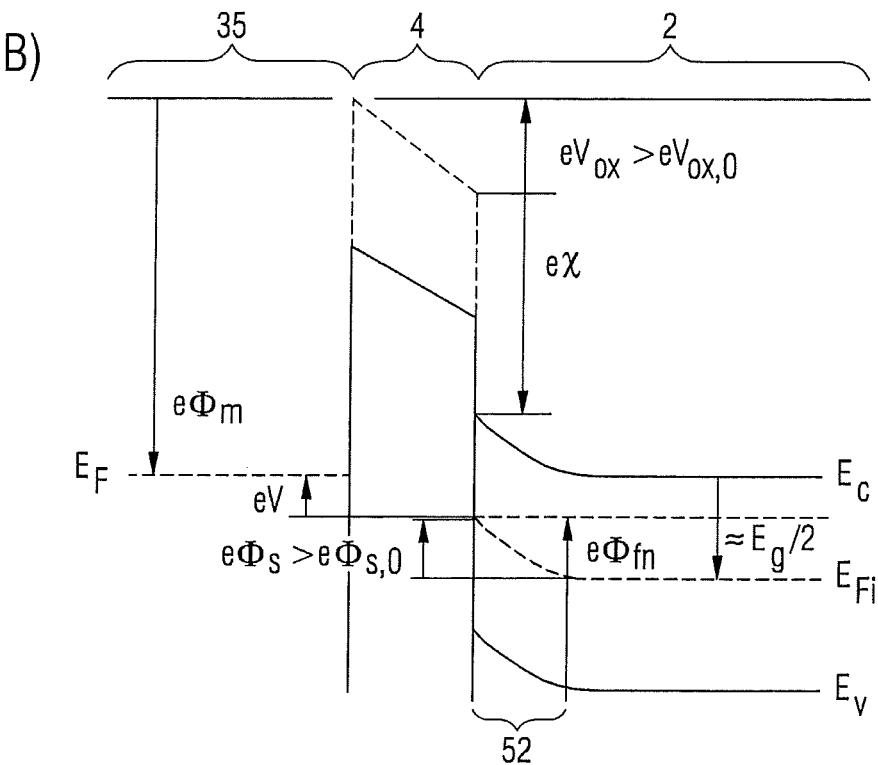

As in FIG. 3, in FIG. 5A the band structure is illustrated in thermal equilibrium and with voltage applied, see FIG. 5B, in the area marked by a dashed dot line in FIG. 4. $N_d$ stands for the donor dopant concentration. Otherwise, the same nomenclature applies as in FIG. 3.

In this example, the work function of the electrode extension 35 must therefore be greater than the sum of the electron affinity and the energy distance of the conduction band from the thermal energy of the semiconductor material to achieve a negative surface potential at the interface between the passivation layer 4 and the semiconductor layer sequence 2 in thermal equilibrium. Then electrons are driven away from this interface and the charge zone, corresponding to the edge region 52, is formed. By applying a negative voltage V, the edge region 52 is enlarged and electrons are displaced out of this region. Again, the applied voltage V is approximately equal to the contact voltage at the n-electrode 32.

Figure 6:
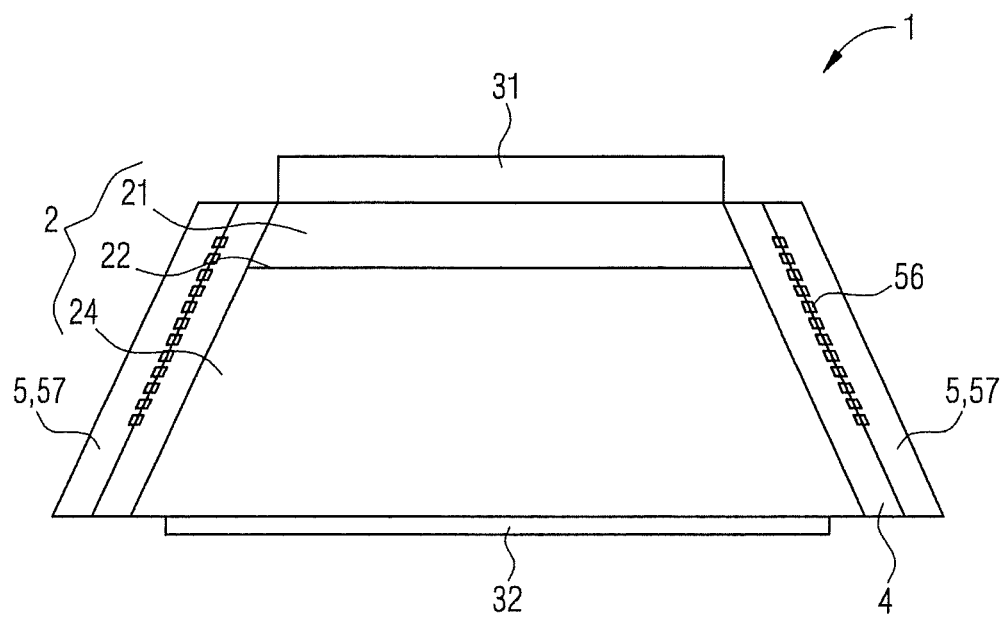

In the example shown in FIG. 6, the edge field generating device 5 is formed by an electrostatic layer 57. The electrostatic layer 57 is electrically insulated from the exterior. In this example, the electrostatic layer 57 has intrinsic charges. This creates fields which in turn generate local charges in the adjacent passivation layer 4 or at the interfaces of passivation layer 4 to electrostatic layer 57 and/or to semiconductor layer sequence 2. Likewise, surface charges can form on the side surfaces 25 within the semiconductor layer sequence 2, not shown in FIG. 6.

Figure 7:
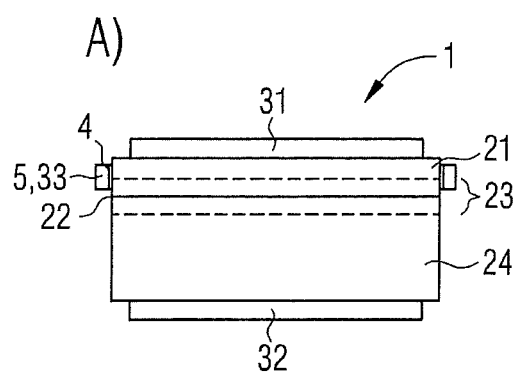
Figure 7:
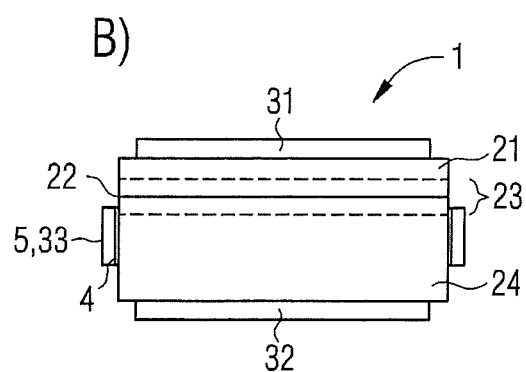

FIG. 7A illustrates that, for example, the further electrode 33 does not extend to the active zone 22, but only partially covers the space charge zone 23. The same can apply to the electrode extension from FIG. 2.

On the other hand, in FIG. 7B the further electrode 33 at the n-conducting region 24 only partially covers the space charge zone 23 so that again the active zone 22 is free of the further electrode 33. The same can apply with regard to the electrode extension, as illustrated in connection with FIG. 4.

Figure 8:
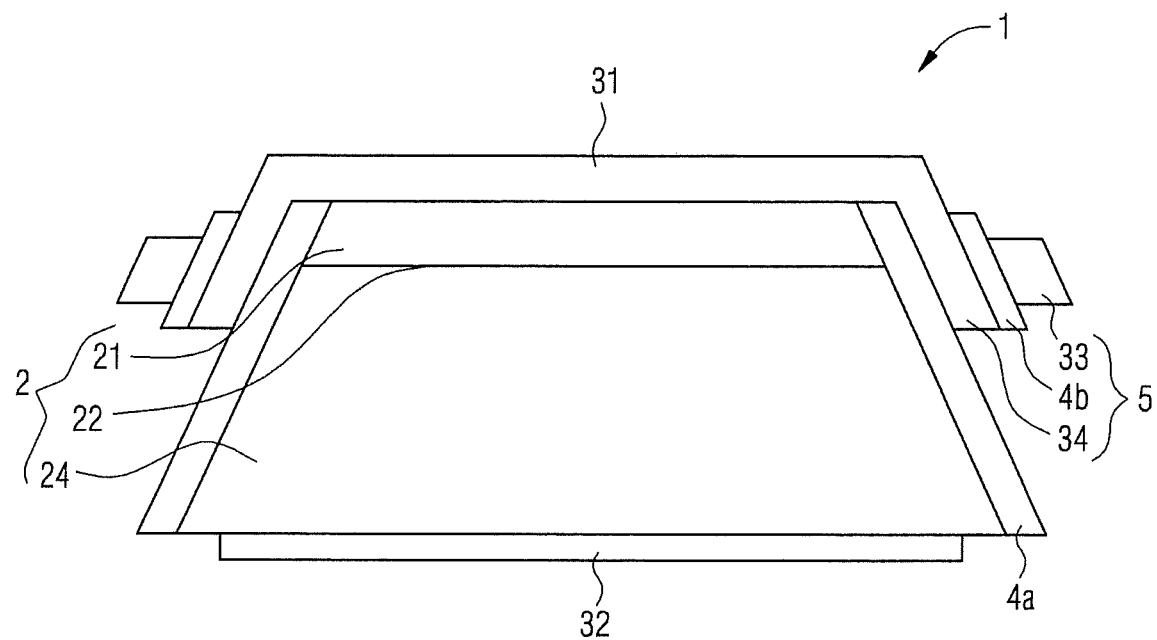

In the example of FIG. 8, the edge field generating device is a combination of an electrode extension 34 and the further electrode 33. The further electrode 33 and the electrode extension 34 are separated from each other by a further electrically insulating passivation layer 4b. The further electrode 33, the additional passivation layer 4b and the electrode extension 34 of the p-electrode 31 are located above the passivation layer 4a.

As in FIG. 8, the further electrode 33 and the electrode extension 35 from FIG. 4 can be combined. It is also possible to combine the further electrode 33 in particular with an electrostatic layer so that the examples of FIGS. 1 and 6 can be combined with each other.

Figure 9:
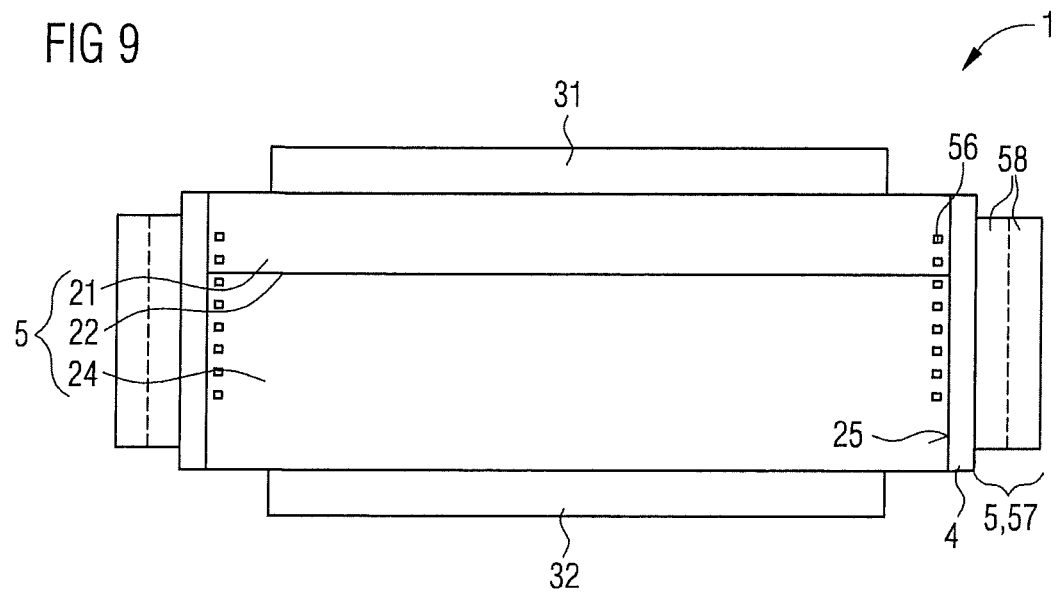

In FIG. 9, the semiconductor device 1 has the electrostatic layer 57 forming the edge field generating device 5. The electrostatic layer 57 is composed of several sublayers 58, which can be charged differently so that the electrostatic layer 57 can be electrically neutral overall. Due to the electric field generated by the edge field generating device 5, surface charges 56 form on the side surfaces 25 in semiconductor layer sequence 2. For example, the sublayers 58 are made of aluminum oxide with different dopant contents. The electrostatic layer 57, in particular its sublayers 58, can have defect induced charges or charges induced by mechanical stresses. Permanent charges can also be generated by the growth conditions. In addition, charges can be induced by plasma treatment.

Figure 10:
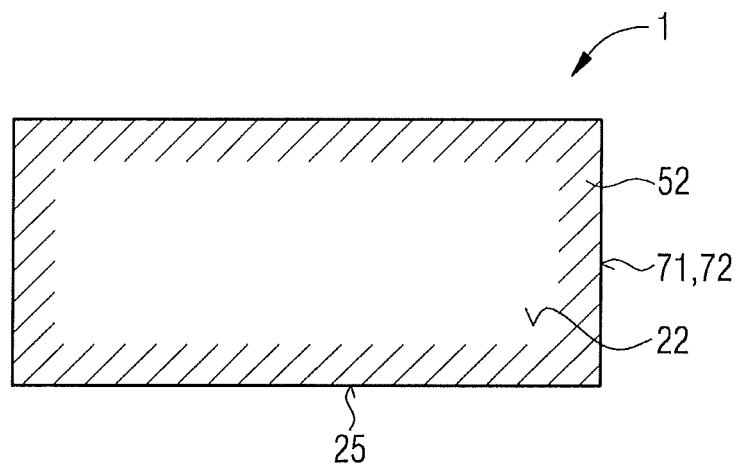
FIGS. 10 to 12, 14 and 21 show schematic top views of active zones of examples of optoelectronic semiconductor devices.

According to the top view of the example in FIG. 10, the active zone 22 has a rectangular ground plan. The edge region 52 extends completely along the side surfaces 25. Thus, the edge region 52 in which no radiation is generated during operation occupies a comparatively large proportion of the active zone 22.

Figure 11:
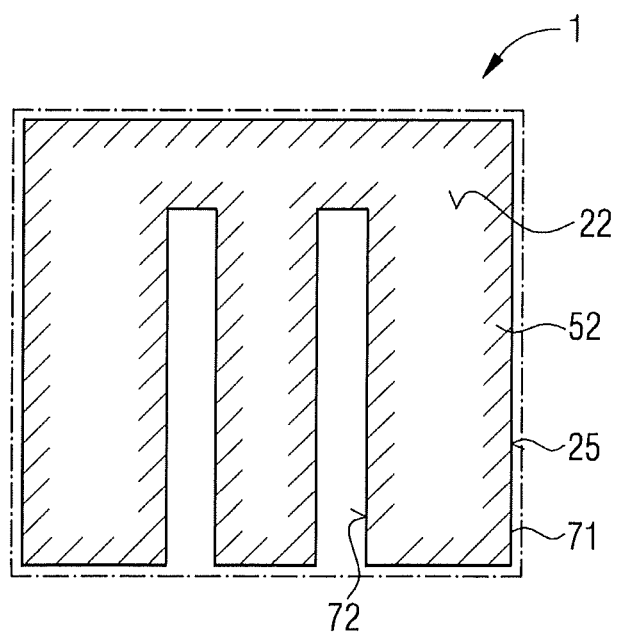
Figure 12:
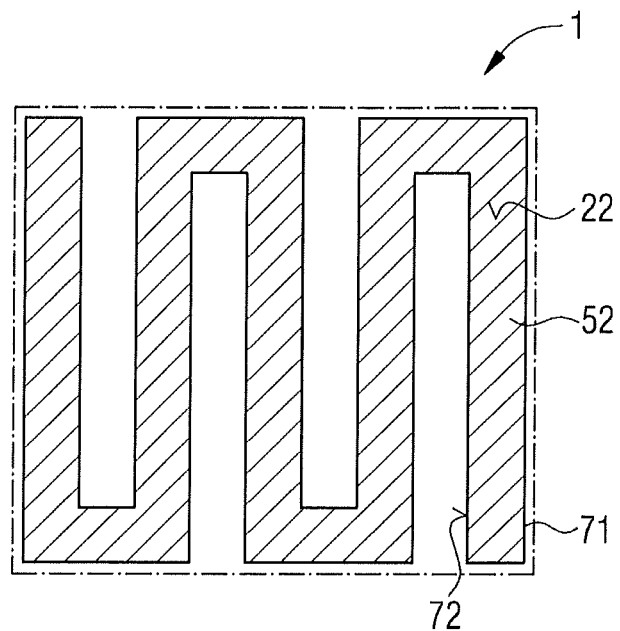

In FIG. 10, as in FIGS. 11 and 12, the edge field generating device is not drawn. In particular, completely along the side surfaces 25, the edge field generating devices 5 from FIGS. 1, 2, 4 or 6 to 9 can be used.

In the example of FIG. 11, a boundary line 72 of the side surfaces 25 is intentionally extended compared to an outer contour line 71. Thus, the edge region 52 occupies a larger portion of the active zone 22 compared to components, as illustrated in FIG. 10. Thus, the active zone 22 can be E-shaped or M-shaped in top view.

In the example of FIG. 12, the active zone 22 is meander-shaped so that a long boundary line 72 is realized within the rectangular outer contour line 71, whereby the outer contour line 71 is filled to a large extent by the active zone 22.

FIG. 12 illustrates that the edge region 52 temporarily occupies the active zone 22 completely. Here, the edge field generating device 5 of FIG. 1 is preferably used so that the extent of the edge region 52 can be adjusted via the voltage applied to the further electrode 33. This means that the further electrode 33 can be used to switch the semiconductor device 1 similar to a transistor. In particular, the radiant power emitted by the semiconductor device 1 during operation can thus be adjusted essentially without current by the voltage applied to the further electrode 33. The same applies to all other examples.

Figure 13:
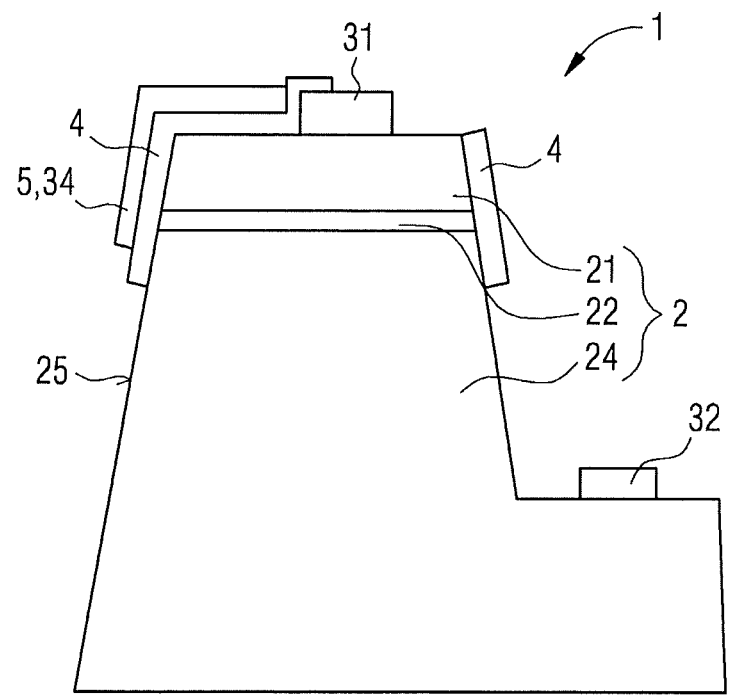

In the example of FIG. 13, the two electrodes 31, 32 point in the same direction. The n-conducting region 24 is removed in places, the n-electrode 32 is applied in the resulting pedestal to the n-conducting region 24. The passivation layer 4 only partially covers the side surfaces 25 of the semiconductor layer sequence 2. The edge field generating device 5 may be formed as a first electrode extension 34 or as a second electrode extension or as a further electrode analogous to FIGS. 1, 2 or 4. Other than shown, the edge field generating device 5 may extend all around the semiconductor layer sequence 2.

Figure 14:
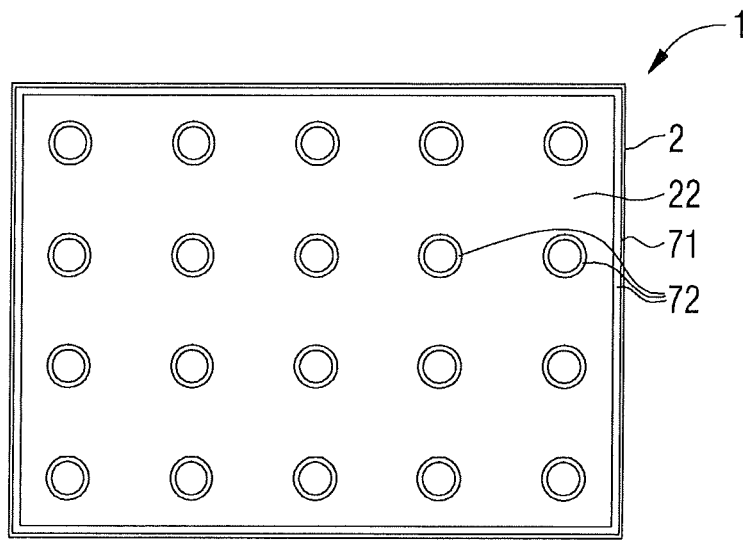

In FIG. 14, a top view of the examples of FIGS. 15 to 20 is shown. In these examples, one of the electrodes, for example, the n-electrode 32, penetrates the active zone 22 from the side where the p-electrode 31 extending in areal manner is located. Thus, a large number of pins are formed from the n-electrode 32, which extend into the n-conducting region 24 and electrically contact it. The edge field generating device 5 is located on the outer, approximately rectangular contour line 71 and also on the pins so that the boundary line 72 on the one hand can be congruent with the outer contour line 71, and on the other hand has many annular lines seen in top view that preferably surround all or at least some of the pins in a 1:1 arrangement.

Figure 15:
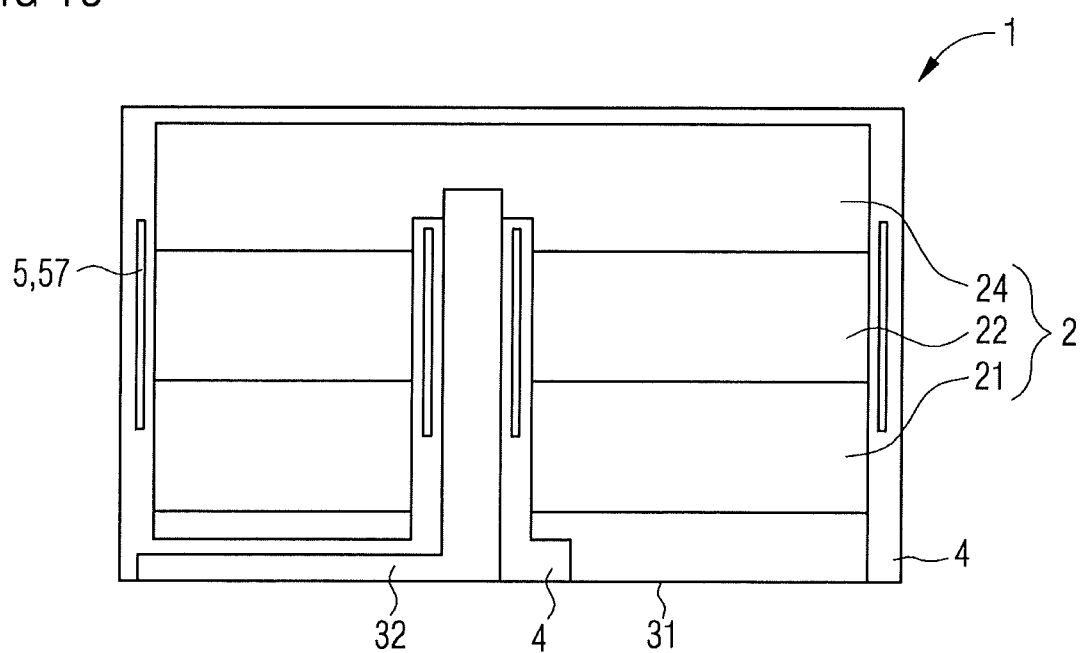

According to FIG. 15, the edge field generating device 5 is configured as an electrostatic layer 57 and integrated into the passivation layer 4.

In FIG. 16, the edge field generating device 5 is electrically coupled to the p-conducting region 21 and thus at the potential of the p-conducting region 21. Optionally, drawn as a dashed line, the edge field generating device 5 can also be directly connected to the p-electrode 31.

In contrast, in FIG. 17, the edge field generating device 5 is electrically coupled at the outer edge only to the n-conducting region 24. The edge field generating device 5 can be located directly on the n-electrode 32 at the pins of the n-electrode 32 through the active zone 22.

In addition, the examples of FIGS. 16 and 17 can be combined with each other. Thus, the internal edge field generating device 5 located at the through-hole through the active zone 22 can be electrically connected to the n-electrode 32, while the edge field generating device 5 is located at the outer edge at the electrical potential of the p-electrode 31 and electrically connects to it. The same may apply vice versa so that the inner edge field generating device 5 is at the p-potential and the outer edge field generating device 5 is at the n-potential.

Figure 18:
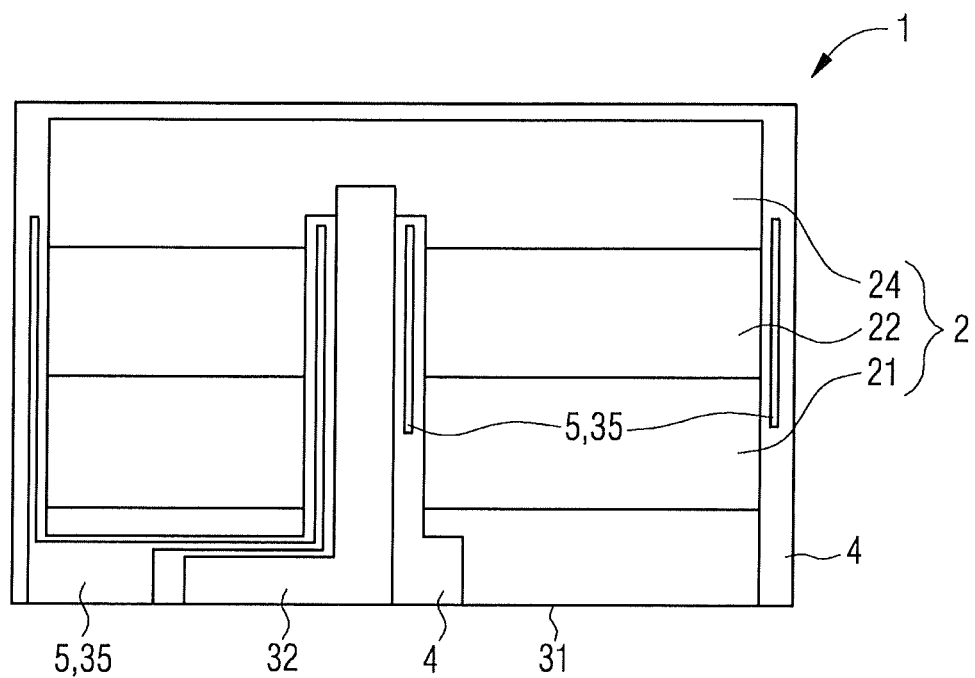

In FIG. 18, the edge field generating device 5 is configured as a further electrode 33. The further electrode 33 can be electrically contacted on the same side as the p-electrode 31 and the n-electrode 32.

The variants shown in connection with FIGS. 15 to 18 can be transferred in the same way to the examples of FIGS. 1, 2 and 4 and in particular FIG. 13.

Figure 19:
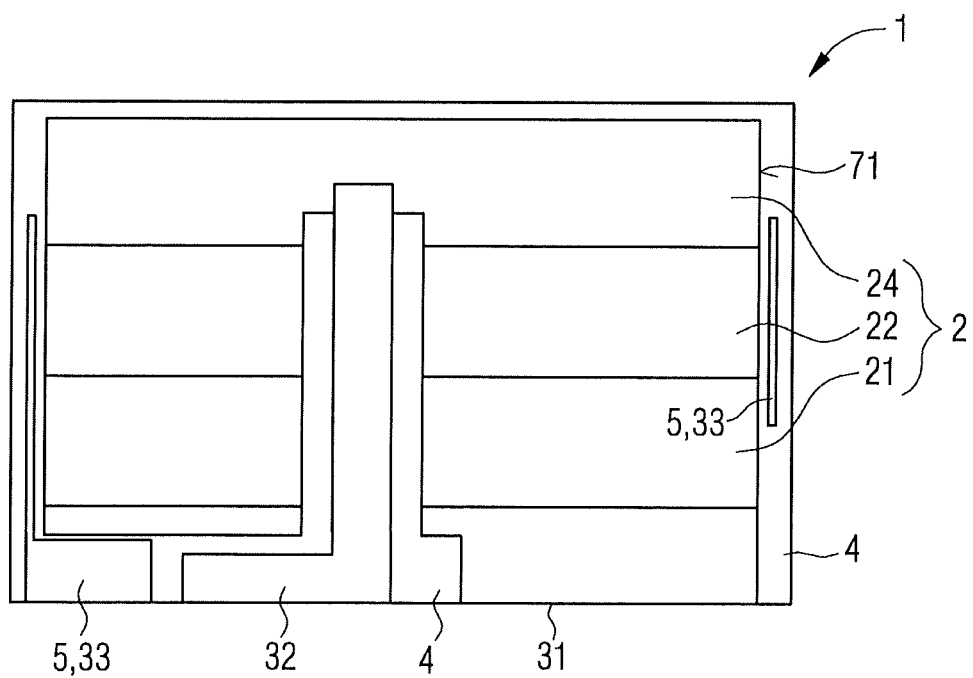

According to FIG. 19, the edge field generating device 5 is configured as a further electrode 33, which is only located at contour line 71. The pins of the n-electrode 32 are free of the edge field generating device. In contrast, in FIG. 20, contour line 71 is free from the edge field generating device 5 so that the edge field generating device 5 is limited to the pins.

Figure 20:
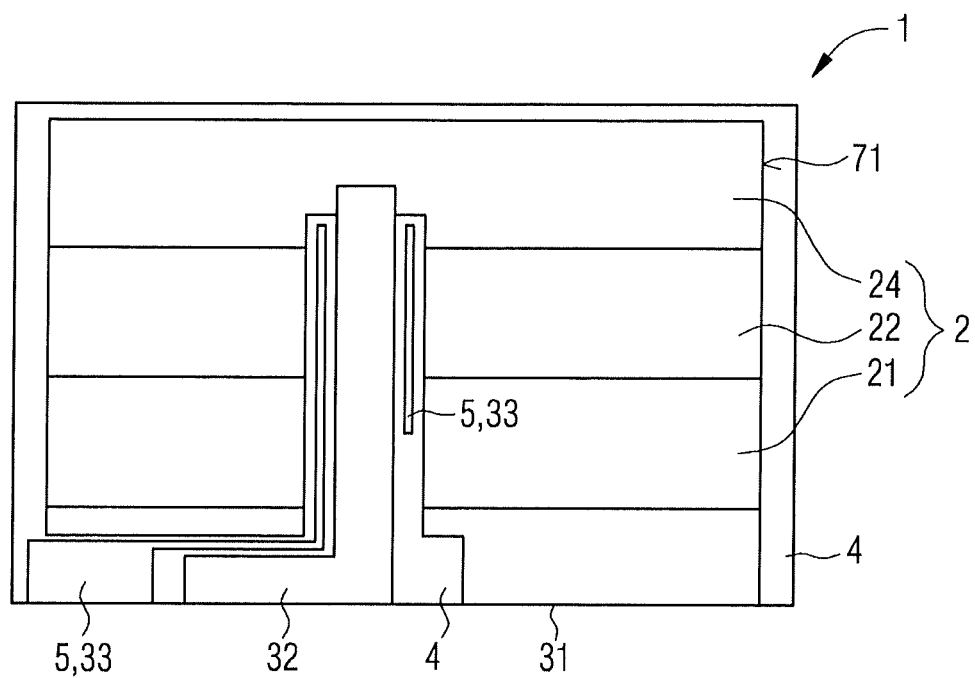

In FIGS. 19 and 20, the edge field generating device 5 corresponds to the configuration of FIG. 18. The configurations of FIGS. 15 to 17 can also be used.

Figure 21:
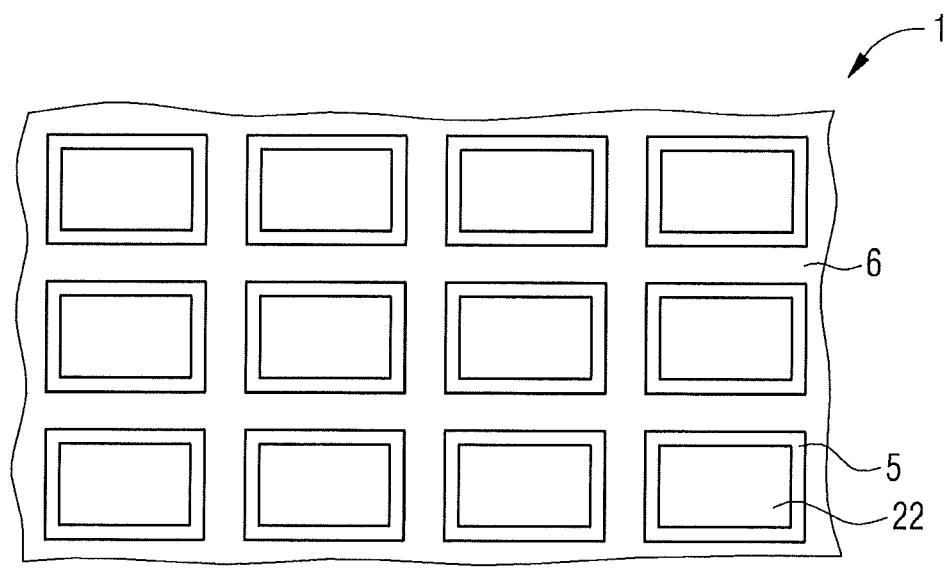

In the example of FIG. 21, the semiconductor layer sequence 2 is pixelated. This means that a large number of islands are structured from the semiconductor layer sequence 2 so that the semiconductor layer sequence 2 between the islands is completely removed or at least the active zone 22 is removed. The semiconductor layer sequence 2 is preferably located on an electrically functionalized carrier 6. The edge field generating device 5 surrounds each of the islands completely or, differently than shown, at least predominantly, preferably in a 1:1 arrangement.

Also, in connection with FIG. 21, the edge field generating device 5 may be modified analogously to FIGS. 15 to 20.

The individual islands may be arranged to emit light of the same or different colors. For example, some of the islands are assigned to an undrawn fluorescent material.

Unless otherwise indicated, the components shown in the figures follow each other directly in the order indicated. Layers not touching each other in the figures are spaced from each other. If lines are drawn parallel to each other, the corresponding surfaces are also aligned parallel to each other. Also, unless otherwise indicated, the relative thickness ratios, length ratios and positions of the drawn components to each other are correctly reproduced in the figures.

The devices and methods described herein are not restricted to the examples by the description on the basis of the examples. Rather, this disclosure encompasses any new feature and also any combination of features that in particular comprises any combination of features in the appended claims and any combination of features in the examples, even if the feature or combination itself is not explicitly specified in the claims or examples.

This application claims priority of DE 10 2017 108 199.2, the subject matter of which is incorporated herein by reference.

The invention claimed is:

1. An optoelectronic semiconductor device comprising:
   a semiconductor layer sequence comprising an active zone that generates radiation by electroluminescence;
   a p-electrode and an n-electrode;
   an electrically insulating passivation layer on side surfaces of the semiconductor layer sequence; and
   an edge field generating device on the side surfaces on a side of the passivation layer facing away from the semiconductor layer sequence at the active zone,
   wherein the edge field generating device is configured to generate an electric field at least temporarily in an edge region of the active zone so that during operation a current flow through the semiconductor layer sequence is controllable in the edge region, and (i) one of said electrodes extends through said active zone in the form of pins and said edge field generating device extends annularly around at least some of said pins and/or (ii) the semiconductor layer sequence is pixelated to islands, the edge field generating device extending directly around at least some of the islands.

2. The optoelectronic semiconductor device according to claim 1,
wherein a current density in the edge region is at a same value as in a central area of the active zone with a tolerance of not more than a factor of 3, and
the edge field generating device runs around the active zone by at least 90% when viewed in top view.

3. The optoelectronic semiconductor device according to claim 1, wherein the edge field generating device comprises an independent further electrode at the active zone, the further electrode being independently controllable of the p-electrode and the n-electrode.

4. The optoelectronic semiconductor device according to the claim 3, wherein a distance between the further electrode and the p-electrode and between the further electrode and the n-electrode is each 10 nm to 5 μm.

5. The optoelectronic semiconductor device according to claim 1,
wherein said edge field generating device comprises a first electrode extension at the active zone, the first electrode extension being electrically short-circuited to the p-electrode, and
the first electrode extension leaves at least 80% of an n-conducting region of the semiconductor layer sequence free at the side surfaces.

6. The optoelectronic semiconductor device according to claim 1,
wherein the edge field generating device comprises a second electrode extension at the active zone, the second electrode extension being electrically short-circuited to the n-electrode, and
the second electrode extension leaving at least 80% of a p-conducting region of the semiconductor layer sequence free at the side surfaces.

7. The optoelectronic semiconductor device according to claim 1, wherein the edge field generating device comprises an electrostatic layer at the active zone such that charges are permanently generated on the side surfaces.

8. The optoelectronic semiconductor device according to claim 7, wherein the electrostatic layer is electrically insulated from the exterior.

9. The optoelectronic semiconductor device according to claim 8, wherein the electrostatic layer comprises a layer stack with at least two differently electrically charged partial regions so that the electrostatic layer as a whole is electrically uncharged.

10. The optoelectronic semiconductor device according to claim 1, wherein the edge field generating device completely covers a space charge zone on the active zone, seen in side view and in projection parallel to the active zone.

11. The optoelectronic semiconductor device according to claim 1, wherein the edge region, in which the current flow is prevented, has an average width of 0.1 μm to 5 μm in top view during intended operation of the semiconductor device.

12. The optoelectronic semiconductor device according to claim 1, wherein, during intended operation of the semiconductor device, a quotient of a total area of the active zone and a length of a boundary line of the edge region is 1 μm to 100 μm.

13. The optoelectronic semiconductor device according to claim 1,
wherein, in top view, the active zone has an boundary line along which the edge region extends that is at least 2 times longer than an outer contour line, and
a base area spanned by the contour line is filled to at least 80% by the active zone.

14. The optoelectronic semiconductor device according to claim 1,
wherein the p-electrode and the n-electrode are each applied directly and in areal manner to the semiconductor layer sequence, and the semiconductor layer sequence is located between the p-electrode and the n-electrode so that the semiconductor device does not comprise a growth substrate of the semiconductor layer sequence, and
the semiconductor layer sequence is based on the AlInGaN material system and configured to generate blue light having a wavelength of maximum intensity of at most 480 nm.

15. The optoelectronic semiconductor device according to claim 1, wherein one of said electrodes extends through said active zone in the form of pins and said edge field generating device extends annularly around at least some of said pins.

16. The optoelectronic semiconductor device according to claim 1,
wherein the semiconductor layer sequence is pixelated to islands, and
the edge field generating device extends directly around at least some of the islands.

17. A method of operating the optoelectronic semiconductor device according to claim 1, wherein an electric field is generated temporarily or permanently in the circumferential edge region of the active zone by the edge field generating device, whereby, during operation, a current flow through the semiconductor layer sequence in the edge region is controlled.

18. The method according to claim 17, with which an optoelectronic semiconductor device comprising:
a semiconductor layer sequence comprising an active zone that generates radiation by electroluminescence;
a p-electrode and an n-electrode;
an electrically insulating passivation layer on side surfaces of the semiconductor layer sequence; and
an edge field generating device on the side surfaces on a side of the passivation layer facing away from the semiconductor layer sequence at the active zone,
wherein the edge field generating device is configured to generate an electric field at least temporarily in an edge region of the active zone so that, during operation, a current flow through the semiconductor layer sequence is controllable in the edge region,
the edge field generating device comprises an independent further electrode at the active zone, the further electrode being independently controllable of the p-electrode and the n-electrode is operated, and
an electrical voltage of at least 30 V is applied at least temporarily to the further electrode.

19. The operating method according to claim 18, wherein, during operation of the optoelectronic semiconductor device, the edge field generating device is operated such that the edge region temporarily occupies at least 50% of the active zone in top view.

* * * * *